United States Patent [19]

Shinohara et al.

[11] Patent Number: 5,665,176
[45] Date of Patent: Sep. 9, 1997

[54] N-TYPE THERMOELECTRIC MATERIALS

[75] Inventors: Kazuhiko Shinohara, Yokohama; Masakazu Kobayashi; Keiko Ikoma, both of Yokosuka; Fumio Munakata, Yokohama, all of Japan

[73] Assignee: Nissan Motor Co., Ltd., Yokohama, Japan

[21] Appl. No.: 277,820

[22] Filed: Jul. 20, 1994

[30] Foreign Application Priority Data

Jul. 30, 1993 [JP] Japan ............... 5-190364

[51] Int. Cl.$^6$ ............... H01L 29/00
[52] U.S. Cl. ............... 148/33; 136/228; 136/236.1; 257/930; 252/62.3 R
[58] Field of Search ............... 136/228, 236.1, 136/237, 239; 257/930; 252/513, 519; 62/3.2; 148/33

[56] References Cited

U.S. PATENT DOCUMENTS

| | | | |
|---|---|---|---|
| 4,589,918 | 5/1986 | Nishida et al. ............... | 136/239 |
| 5,009,717 | 4/1991 | Komabayashi et al. ............... | 136/236.1 |
| 5,057,161 | 10/1991 | Komabayashi et al. ............... | 136/236.1 |
| 5,069,868 | 12/1991 | Tokiai et al. ............... | 419/23 |

FOREIGN PATENT DOCUMENTS

| | | |
|---|---|---|
| 0099784 | 6/1984 | Japan . |
| 0008707 | 4/1991 | Japan . |
| 0107407 | 4/1994 | Japan . |

OTHER PUBLICATIONS

English Translation of the JP-0107407.

*Primary Examiner*—Trung Dang
*Attorney, Agent, or Firm*—Lowe, Price, LeBlanc & Becker

[57] ABSTRACT

An n-type thermoelectric material composed mainly of an iron-silicite compound represented by a chemical formula of $FeSi_{2+z}$ in which $-0.1<z<0.1$. The thermoelectric material further comprising Co as an n-type dopant and Ge as an additive. The iron-silicon compound is composed substantially of a low temperature phase (β-phase).

5 Claims, 3 Drawing Sheets

FIG_1
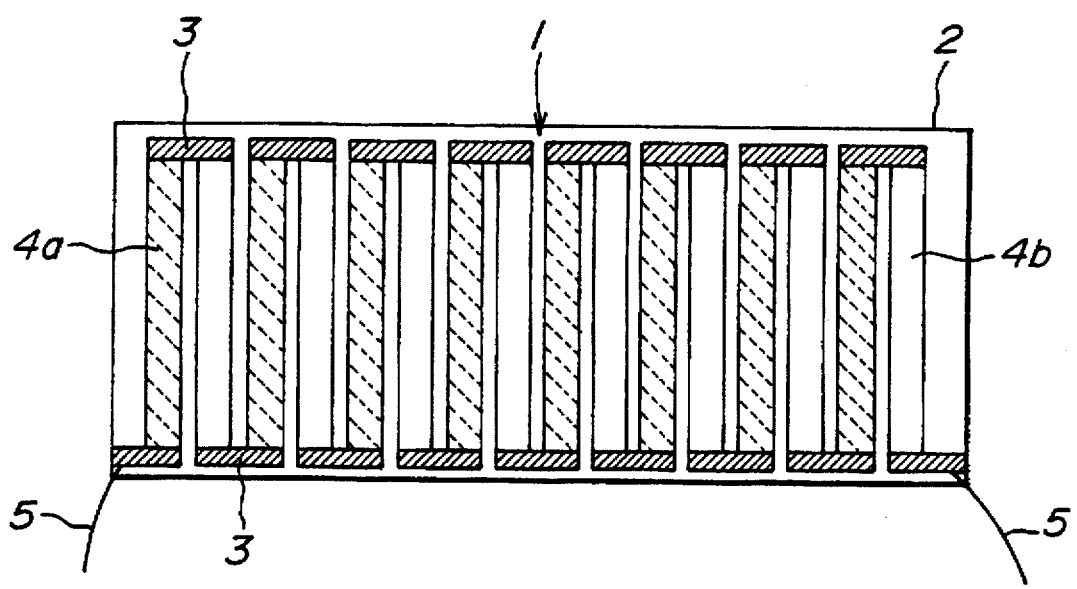

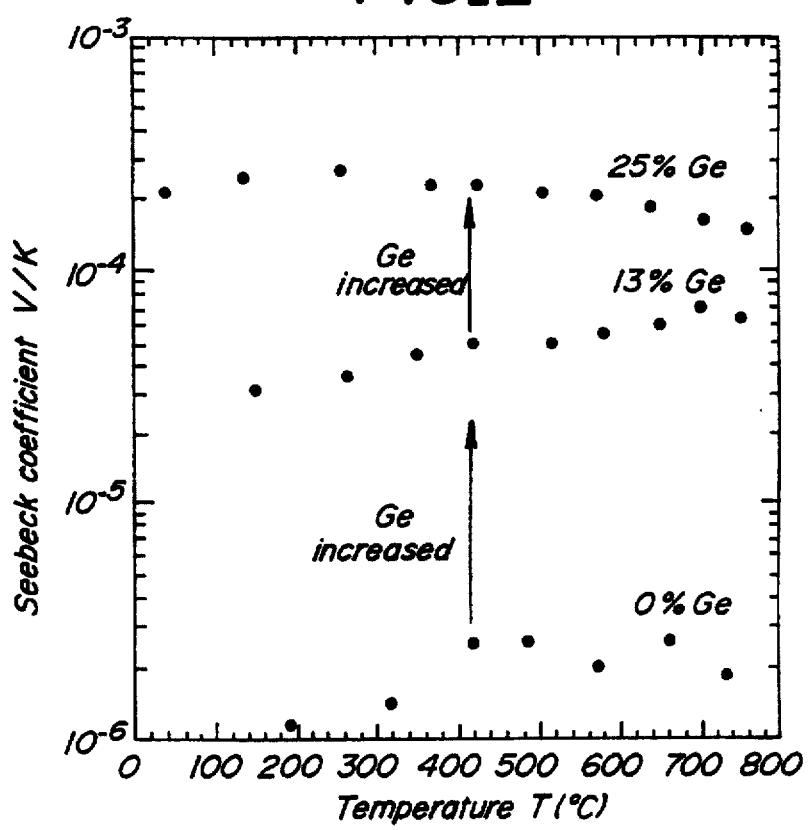
FIG_2
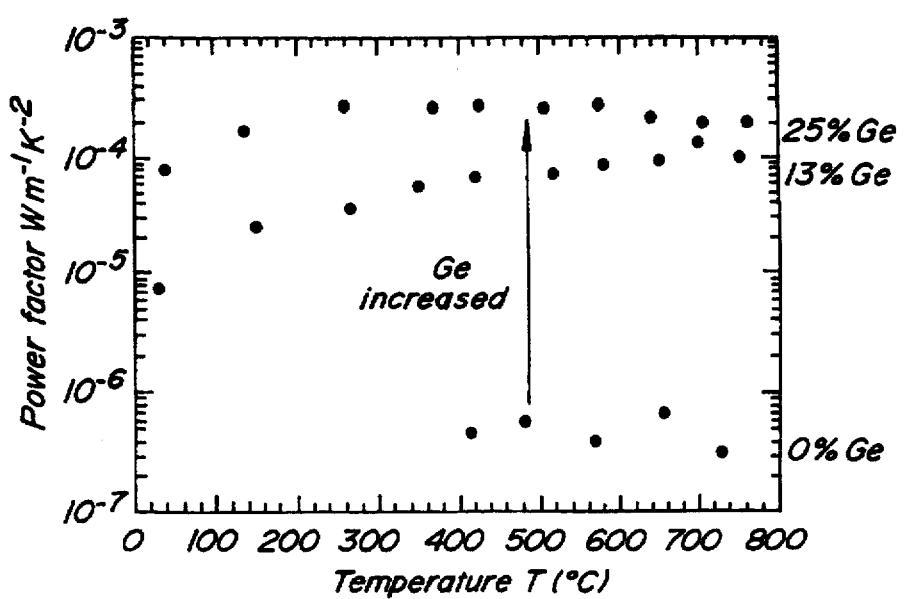
FIG_3

N-TYPE THERMOELECTRIC MATERIALS

BACKGROUND OF THE INVENTION (1) Field of the Invention

The present invention relates to n-type thermoelectric materials to be used for exhibiting so-called thermoelectric effects (direct energy conversion without relying upon moving parts) such as thermoelectric generation due to Seebeck effect or thermoelectric cooling due to Peltier effect.

(2) Related Art Statement

As the thermoelectric effects in the thermoelectric conversion such as thermoelectric generation and the thermoelectric cooling, the Seebeck effect, the Peltier effect, and the Thomson effect may be recited. The Seebeck effect is a phenomenon that when different kinds of conductors or a p-type conductor and a n-type conductor are joined together and one of the joined portions is set at a high temperature, whereas the other being at a low temperature, a thermally generated emf (electromotive force) occurs depending upon a temperature difference. The Peltier effect is a phenomenon that when different kinds of conductors or a p-type conductor and a n-type conductor are joined together and current is flown through them, heat is absorbed in one of the joined portions and heat is generated in the other. The Thomson effect is a phenomenon that one end of a uniform conductor or semiconductor is set at a high temperature, the other being at a low temperature, and DC current is passed therethrough along a temperature gradient, heat is absorbed into or emitted from the conductor or semiconductor depending upon a direction in which the current is flown. Such thermoelectric materials are suitably used in simplified direct energy converters having no moving parts susceptible of vibrations, noises, abrasion, etc., simplified structures, high reliability and long use life with easy maintenance. For example, such thermoelectric materials may be used for cases where DC power are obtained by the combustion of various foil fuels or where temperatures are controlled without using coolant.

When such a thermoelectric element is used for the thermoelectric generation, it is desired that the thermoelectric material has a high figure of merit ($Z=3\times10^{-3}$ [l/K] or more), and stably works under given use conditions for an extended time period. Further, it is necessary that the thermoelectric element is stable in an oxidizing atmosphere and its performance is not deteriorated.

Heretofore, as such thermoelectric materials, tellurium-based compounds such as $Bi_2Te_3$, $Bi_2Sb_8Te_{15}$, $BiTe_2Se$ and PbTe, silicide-based compounds such as $CrSi_2$, $MnSi_{1.73}$, $FeSi_2$, $CoSi_2$, and their mixtures, and SiGe have been used.

However, although the thermoelectric materials composed of the tellurium-based compounds represented by Bi-Te series have relatively high figures of merit, Z, of about $3\times10^{-3}$ [l/K] near room temperature, which are indicative of the thermoelectric performance, the performance is deteriorated at above 300° C. Accordingly, use temperatures are largely limited. Further, since a volatile component such as tellurium or selenium is contained in the material composition, the melting point is low and the chemical stability is low. Further, since producing steps are complex, the performance is likely to vary due to variations in the composition.

As compared with the thermoelectric material composed of the tellurium-based compound, the silicide-based materials have chemical stability, and can be used in a temperature range of 300° C. or more. However, the thermoelectric performance of the silicide-based materials is as small as $3\times10^4$ [l/K] as the figure of merit at the maximum, which is lower than that of the tellurium-based compounds by one order or more. As to the silicide-based compounds, sufficient thermoelectric performance comparable to the tellurium-based compounds has not been obtained.

Consequently, it has been demanded to develop thermoelectric materials for use at high temperatures, which have sufficient thermal resistance at high temperatures of 300° C. or more, are stable in the oxidizing atmosphere with their performance being unlikely to be deteriorated, and have excellent thermoelectric performance at high temperatures.

SUMMARY OF THE INVENTION

The present invention has been accomplished in view of such conventional problems, and the invention is particularly aimed at the provision of thermoelectric materials suitable for use at high temperatures, which thermoelectric materials have excellent thermoelectric performance at high temperatures and sufficient thermal resistance at high temperatures, are stable in oxidizing atmosphere and unlikely to suffer deterioration of the performance.

The n-type thermoelectric material according to the present invention is composed mainly of an iron-silicon compound represented by a chemical formula of $FeSi_{2+z}$ in which $-0.1<z<0.1$, said thermoelectric material further comprising Co as an n-type dopant and Ge as an additive, said iron-silicon compound being composed substantially of a low temperature phase (β-phase). By thus constructing the n-type thermoelectric material according to the present invention, the conventional problems stated before can be solved.

As a preferable embodiment of the present invention, the chemical formula is $(Fe_{1-x}Co_x)(Si_{1-y}Ge_y)_{2+z}$ in which $0<x<0.1, 0<y<3$ and $-0.1<z<0.1$.

The n-type thermoelectric material according to the present invention relates to the thermoelectric material composed mainly of the iron-silicon compound represented by the chemical formula of $FeSi2+z$ in which $-0.1<z<0.1$. If z is less than $-0.1$, the crystalline structure of the iron-silicon compound ($FeSi_{2+z}$) is of a mixed phase of $FeSi+FeSi_2$, and the FeSi phase causes reduction in the thermoelectric conversion efficiency of the thermoelectric material. Further, if z is more than 0.1, the crystalline structure of the iron-silicon compound ($FeSi_{2+z}$) is of a mixed phase of $Si+FeSi_2$, and the excess Si phase functions as a factor for distributing a conductive carrier. Thus, this makes an adverse influence similar to the above FeSi phase. Therefore, it is indispensable that $-0.1<z<0.1$.

When Fe and Si in the iron-silicon compound are 1:2 in terms of the molar ratio ($FeSi_2$) and the iron-silicon compound is substantially converted to the lower temperature phase (β-phase), the crystalline structure is composed substantially of a orthorhombic structure. When z in the iron-silicon compound of the formula: $FeSi_{2+z}$ is $-0.1<z<0.1$, the orthorhombic structure of the iron-silicon compound is substantially maintained, although the Si-sites partially lacks ($0.1<z<0$) or a slight amount of Si precipitates besides $FeSi_2$.

The $FeSi_2$ has two phases, i.e., a high temperature phase (α-phase) and the above low temperature phase (β-phase). In order to employ the iron-silicon compound for the thermoelectric power generation, the iron-silicon compound: $FeSi_2$ needs be substantially of the low temperature phase (β-phase). The iron-silicon compound can be converted to substantially the β-phase by the conventional technique. That the iron-silicon compound needs be substantially of the low temperature phase (β-phase) means that an impurity such as α phase may be contained so long as the thermoelectric property aimed at by the present invention is maintained.

The n-type thermoelectric material of the present invention is characterized in that at least Co as a n-type dopant and at least Ge as an additional element are incorporated into the thermoelectric material composed of the iron-silicon based material represented by the chemical formula of $FeSi_{2+z}$ in which $-0.1<z<0.1$. In this case, it is preferable that the chemical formula of the iron-silicon compound is represented by $(Fe_{1-x}Co_x)(Si_{1-y}Ge_y)_{2+z}$ in which $0<x\ 0.1, 0<y<3$ and $-0.1<z<0.1$.

When $x<0.1$, Co substitutes Fe in the crystalline structure of $FeSi_2$, and releases electrons to function as donors. As a results, electric conductivity increases, the figure of merit rises. To the contrary, as is seen above, if $x>0.1$, Co may function to disturb the crystalline structure of $FeSi_2$, and to cause disturbance of the carriers which is unnecessary for the thermoelectric conversion. Furthermore, this may cause reduction in the thermoelectromotive force, and decrease the figure of merit in the thermal conversion.

In the above preferable embodiment, $0<y<0.3$. When y falls in this range, Ge substitutes for Si in the $FeSi_2$ crystal is replaced by Ge to modify the electronic structure thereof. This forms a level of an acceptor as a supply source for carriers (holes) near a center of an energy gap. As a result, Ge functions as a factor for distributing carriers at a low energy, which carriers are unnecessary for the thermoelectric generation, and Ge also functions as a source for supplying carriers to increase the electric conductivity.

The n-type thermoelectric material according to the present invention is characterized in that both Ge and Co are incorporated into the material. With respect to impurities, such as Co, mixed into $FeSi_2$, some impurities function to produce carriers (electrons), whereas other do not, that is, function as a factor to disturb the carriers or produce carriers at low energy levels (the levels near the center of the energy gap). Since Ge compensates for the function of Co acting as the factor for disturbing the carrier or producing the low energy carriers, the carrier effectively contributable to the thermoelectric effect can be more effectively taken out by mixing Ge.

However, if $y>0.3$, Ge may disturb the crystalline structure, or function as a factor for disturbing the carrier effective for the thermoelectric effect as an impurity. As a result, this lowers the conversion efficiency in the thermoelectric generation. Therefore, $0<y<0.3$ in the above preferred embodiment.

As mentioned above, the n-type thermoelectric material according to the present invention is characterized in that Co as an n-type dopant and Ge as an additive are incorporated into Fe and Si. In addition to Co, Ni, Pd and/or Pt may be added as n-type dopant. Further, when the n-type thermoelectric material according to the present invention is joined to a p-type thermoelectric material in which a p-type dopant such as Mn, Cr, Al and/or Ge is incorporated into $FeSi_2$, the thermoelectric performance can be further enhanced. The total amount of the p-type dopant is preferably not more than 5 atomic % relative to the entire weight of the thermoelectric material.

The n-type thermoelectric material according to the present invention is composed mainly of the above iron-silicon compound having the chemical composition of $FeSi_{2+z}$ ($0<z<0.1$) in which Co and Ge are incorporated. Therefore, the thermoelectric material of the invention is a thermoelectric material for high temperatures, has excellent thermoelectric performance at high temperatures, sufficient heat resistance at high temperatures and high stability even in oxidizing atmosphere, and is difficult to degrade.

These and other objects, features and advantages of the invention will be appreciated upon reading of the invention when taken in conjunction with the attached drawings.

BRIEF DESCRIPTION OF THE DRAWINGS

For a better understanding of the invention, reference is made to the attached drawings, wherein:

FIG. 1 is a schematic view for illustrating a thermoelectric element using a thermoelectric material as one embodiment of the present invention; FIG. 2 is a graph for illustrating dependency upon the temperature of Seebeck coefficients S of iron-silicide thermoelectric thin films containing 6 atomic % Co in which the amount of Ge is varied;

FIG. 3 is a graph for illustrating dependency upon the temperature of power factors X of iron-silicide thermoelectric thin films containing 6 atomic % Co in which the amount of Ge is varied;

DETAILED DESCRIPTION OF THE INVENTION

Figure 4:
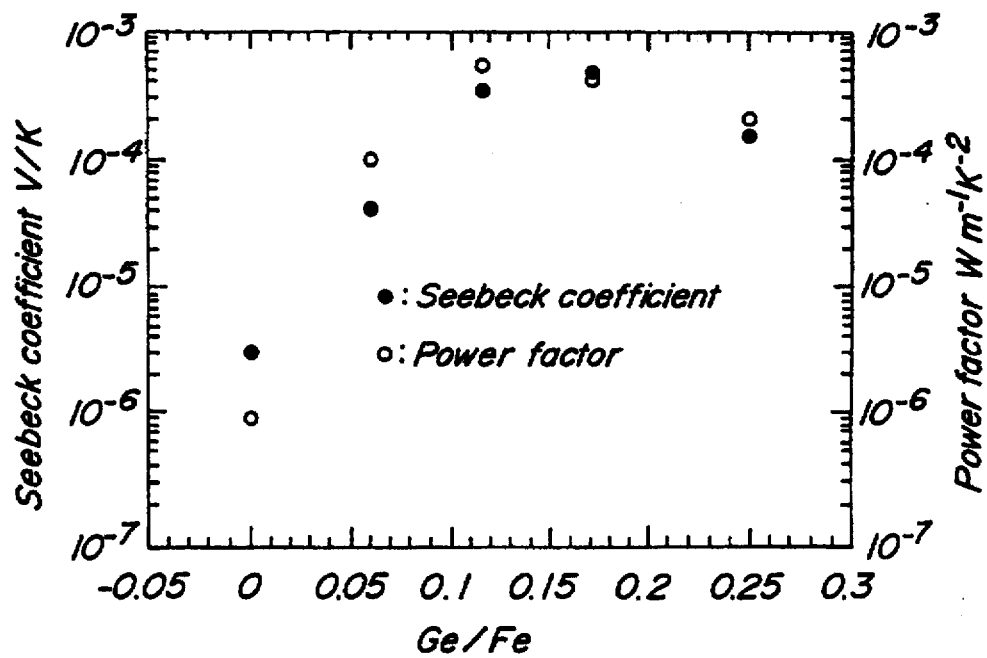
FIG. 4 is a graph for illustrating dependency of the Seebeck coefficients S and power factors X upon the amount of Ge at 700° C. iron-silicide thermoelectric thin films containing 6 atomic % Co in which the amount of Ge is varied.

The present invention will be explained more in detail.

First, a process for producing the n-type thermoelectric material according to the present invention will be generally explained.

In general, the n-type thermoelectric material according to the present invention may be produced by the sputtering process or by the powder-sintering process.

(1) The sputtering process may be effected in the following manner.

i) Given amounts of starting materials are measured, and mixed together.

ii) Then, the mixture is charged into a press mold, and compacted.

iii) The compacted mass is sintered at around 800° C. in an inert gas such as Ar to obtain a sputtering target.

iv) A thick film of an n-type thermoelectric material is heaped on a substrate kept at, e.g., room temperature to 400° C., by using this target according to the sputtering process.

(2) The powder-sintering process may be effected in the following manner.

i) Given amounts of starting materials are measured, and combined together, and the mixture is melted under stirring at a temperature not less than the melting point of $FeSi_2$.

ii) After the melt is cooled to obtain an ingot, the ingot is pulverized and is press molded.

iii) The molded body is sintered at a temperature of around 1,200° C. in an inert gas such as Ar, thereby obtaining a bulky n-type thermoelectric material. Since the bulky sintered body contains much high temperature phase (α phase), the body is further thermally treated at a temperature of, for example, around 800° C. for a given time, i.g., 100 hrs, to convert all the high temperature phase to the low temperature phase.

[Experiments]

Given amounts of $FeSi_2$, $FeGe_2$ and $CoS_2$ powders were measured, and mixed as starting materials. Then, the mixture was compacted into pellets under molding pressure of 1 tons/cm$^2$, which were fired in Ar atmosphere under ordinary pressure (not more than 800° C.), thereby obtaining a target material having a diameter of 55 inches for sputtering. The composition of the target was determined, considering a sputtered percentage of each element (The sputtered percentage of Fe is about a half of that of Si).

The target material needs not always take the crystalline structure of the above compound, but may be formed by mixing given amounts of elements of Fe, Si, Ge and Co and molding the mixture. As a substrate, $SiO_2$ was used. Several targets were prepared, which gave (Si+Ge)/(Fe+Co)=2.0, Ge/Si=0.0–0.3, and Co/Fe=0.0–0.1 in terms of the composition ratios of the final elements. The composition ratios of the targets prepared in this experiments are shown in Table 1. Further, in order to obtain intended film compositions, the composition ratios of Si and Ge were finely controlled by uniformly placing a necessary amount of small diameter pellets of Si alone and those of Ge (diameter: 1 cm) on the target.

The composition ratios of the targets used in this experiment are shown in Table 2. The sputtering conditions were:

1) Temperature of substrate: 400° C.
2) Ar atmosphere: 0.8 mTorr
3) Incident/emitting FR power: 500/2W
4) Film thickness: 1 μm After the film was formed, the film was thermally heated at 800° C. in Ar or open air for 1 hour so as to crystallize the film.

TABLE 1

| | Composition ratio in target | | | |
|---|---|---|---|---|
| No. | Fe | Co | Si | Ge |
| 1 | 1 | 0 | 2 | 0 |
| 2 | 1 | 0 | 2 | 0.2 |
| 3 | 1 | 0.05 | 2 | 0.1 |
| 4 | 1 | 0.1 | 2 | 0.4 |
| 5 | 1 | 0.1 | 2 | 0 |

TABLE 2

$(Fe_{1-x}Co_x)(Si_{1-y}Ge_y)_{2+z}$

| No. | x | y | z | Maximum power factor X (mW/m/K) |
|---|---|---|---|---|
| 1 | 0 | 0 | 0 | 0 |
| 2 | 0.06 | 0 | 0 | 0.003 |
| 3 | 0.1 | 0 | 0 | 0.01 |
| 4 | 0.1 | 0.13 | 0 | 0.15 |
| 5 | 0.1 | 0.25 | 0 | 0.3 |
| 6 | 0.06 | 0.06 | 0 | 0.1 |
| 7 | 0.06 | 0.17 | 0 | 0.45 |
| 8 | 0.06 | 0.12 | 0 | 0.55 |
| 9 | 0.05 | 0.13 | 0 | 0.18 |
| 10 | 0.07 | 0.13 | 0 | 0.2 |
| 11 | 0.08 | 0.13 | 0 | 0.1 |
| 12 | 0.06 | 0.13 | 0.05 | 0.2 |
| 13 | 0.06 | 0.13 | 0.1 | 0.1 |
| 14 | 0.06 | 0.13 | 0.15 | 0.07 |
| 15 | 0.06 | 0.13 | −0.05 | 0.2 |
| 16 | 0.06 | 0.13 | −0.1 | 0.2 |

TABLE 2-continued $(Fe_{1-x}Co_x)(Si_{1-y}Ge_y)_{2+z}$

| No. | x | y | z | Maximum power factor X (mW/m/K) |
|---|---|---|---|---|
| 17 | 0.06 | 0.13 | −0.15 | 0.06 |

FIG. 1 shows a schematic view for illustrating a thin filmy thermoelectric element produced by sputtering the target obtained above. In this thin filmy thermoelectric element 1, an Ag electrode 3, n-type iron-silicide thermoelectric films 4a into which Ge and Co are incorporated according to the present invention, and a p-type iron-silicide thermoelectric film 4b are formed on an $SiO_2$ substrate 2. A reference numeral 5 is a lead for the Ag electrode.

Figure 5:
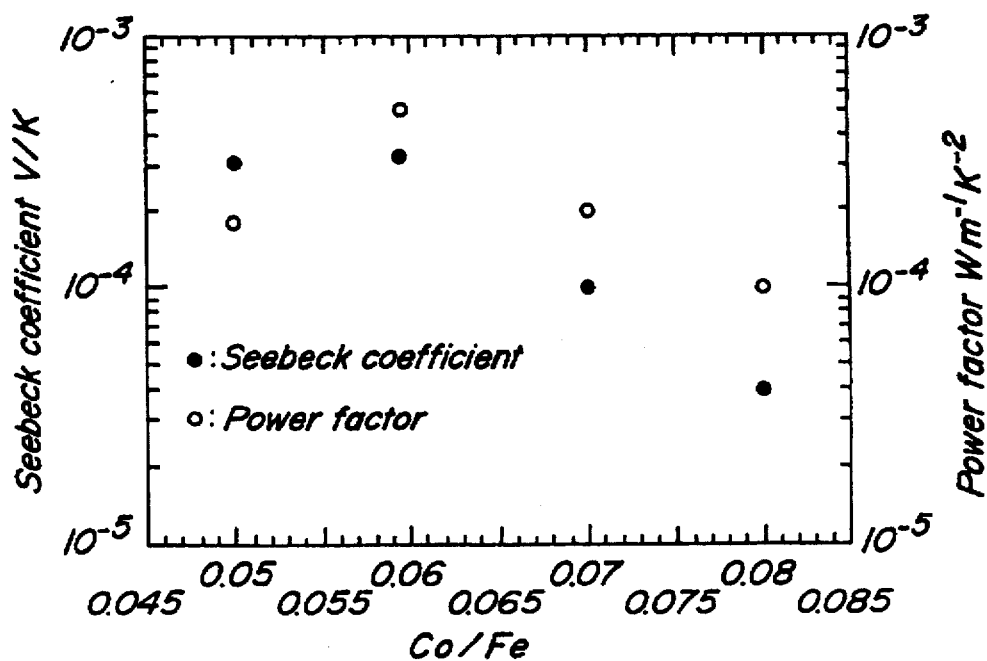
FIG. 5 is a graph for illustrating dependency of the Seebeck coefficients S and power factors X upon the amount of Ge at 600° C. iron-silicide thermoelectric thin films containing 6 atomic % of Co in which the amount of Ge is varied.

FIG. 2 shows dependency of the Seebeck coefficient S upon the temperature with respect to the thermoelectric iron-silicide thin films containing 6 atomic % of Co in Example Nos. 6 through 8 in Table 2 in which the amount of Ge was varied. Further, FIG. 3 shows dependency of the power factor X ($Wm^{-1}K^{-2}$) upon the temperature with respect to the iron-silicide thermoelectric thin films containing 6 atomic % of Co in which the amount of Ge was varied. FIG. 4 shows dependency of the Seebeck coefficient S and the power factor X ($Wm^{-1}K^{-2}$) upon the content of Ge at 700° C. with respect to the above samples. FIG. 5 shows dependency of the Seebeck coefficient S and the power factor X ($Wm^{-1}K^{-2}$) upon Co at 600° C. with respect to the thermoelastic thin film of iron silicide.

As is clear from FIGS. 2 and 3, the thermoelectric performance is enhanced by incorporating Ge into the $FeSi_2$ film containing a given amount of Co. Further, as is clear from FIG. 4, the thermoelectric performance is greatly enhanced in the case of the sample containing about 17 atomic % of Ge as compared with a samples containing no Ge. Furthermore, as is clear from FIG. 5, the optimum content of Co is about 6 atomic % when the content of Ge is about 12%.

Therefore, as shown in FIG. 4, it is clear that the power factor X is remarkably enhanced in the case of the thermoelectric material containing Ge and Co, as compared with a case of a thermoelectric material containing neither Co nor Ge. Thus, the present invention can provide the thermoelectric material having largely improved thermoelectric performance.

Ordinarily, according to the thermoelectric elements, the n-type thermoelectric material and the p-type thermoelectric material are used in combination. With respect to the n-type thermoelectric material according to the present invention, larger power can be obtained besides the effects mentioned above Examples, when the n-type thermoelectric material is used in combination with the p-type thermoelectric material in which Ge, Cr, Mn and/or Al is incorporated into $FeSi_2$. The p-type dopant is preferably contained in a total amount of not more than 5 atomic % relative to the total weight of the p-type thermoelectric material.

Further, since the thermoelectric material of this type fundamentally possesses the crystalline structure of $FeSi_2$, the material containing the n-type impurity or impurities has the same crystalline structure as that of the p-type thermoelectric material. Therefore, these n-type and p-type thermoelectric materials have the same thermal stability and the same coefficient of thermal expansion. Therefore, the p-n joint can be easily effected by dry powder pressing. Further, even if the thermoelectric material is used in and exposed to open atmosphere or petroleum flame at more than 900° C., its thermal performance is not deteriorated. Thus, the thermoelectric material of the present invention is an economical material having excellent heat resistance and excellent moldability.

As explained above, the thermoelectric material according to the present invention composed mainly of an iron-silicon compound represented by a chemical formula of $FeSi_{2+z}$ in which $-0.1<z<0.1$, said thermoelectric material further comprising Co as an n-type dopant and Ge. Therefore, the thermoelectric performance can be further enhanced as compared with that of the conventional thermoelectric material in which only Co is incorporated into $FeSi_2$. In addition, the present invention can thus provide a thermoelectric material which has fully practical heat resistance at high temperatures and stability even in the oxidizing atmosphere, and is unlikely to deteriorate its performance. For example, the invention has a greater advantage that when the thermoelectric material is used for the thermoelectric generation, greater power can be taken out in an external load.

Moreover, when the chemical formula is $(Fe_{1-x}Co_x)(Si_{1-y}Ge_y)_{2+z}$ in which $0<x<0.1$, $0<y<3$ and $-0.1<z<0.1$, the electric conductivity is enhanced, and the figure of merit rises.

What is claimed is:

1. An n-type thermoelectric material composed mainly of an iron-silicon compound represented by a chemical formula of $FeSi_{2+z}$ in which $-0.1<z<0.1$, said thermoelectric material further comprising Co as an n-type dopant and Ge as an additional element, said iron-silicon compound being composed substantially of a low temperature phase ($\beta$-phase).

2. The n-type thermoelectric material set forth in claim 1, wherein said chemical formula is $(Fe_{1-x}Co_x)(Si_{1-y}Ge_y)_{2+z}$ in which $0<x<0.1$, $0<y<3$ and $-0.1<z<0.1$.

3. The n-type thermoelectric material set forth in claim 1, which further comprises an n-type dopant at least one element selected from the group consisting of Ni, Pd and Pt.

4. A composite body comprising an n-type thermoelectric material and a p-type thermoelectric material joined together, said n-type thermoelectric material being composed mainly of an iron-silicon compound represented by a chemical formula of $FeSi_{2+z}$ in which $-0.1<z<0.1$, said thermoelectric material further comprising Co as an n-type dopant and Ge as an additive, said iron-silicon compound being composed substantially of a low temperature phase ($\beta$-phase), said p-type thermoelectric material being composed mainly of an iron-silicon compound represented by a chemical formula of $FeSi_{2+z}$ in which $-0.1<z<0.1$, said p-type thermoelectric material further comprising a p-type dopant selected from the group consisting of Mn, Cr, Al and Ge.

5. The composite body set forth in claim 4, wherein said p-type dopant is in a total amount of not more than 5 atomic % relative to the total weight of the p-type thermoelectric material.

* * * * *